(12) United States Patent
Oishi et al.

(10) Patent No.: US 6,376,276 B1
(45) Date of Patent: Apr. 23, 2002

(54) METHOD OF PREPARING DIAMOND SEMICONDUCTOR

(75) Inventors: Ryuichi Oishi, Nara; Yoshinobu Nakamura, Osaka, both of (JP)

(73) Assignee: Sharp Kabushiki Kaisha, Osaka (JP)

(*) Notice: Subject to any disclaimer, the term of this patent is extended or adjusted under 35 U.S.C. 154(b) by 41 days.

(21) Appl. No.: 09/644,671

(22) Filed: Aug. 24, 2000

(30) Foreign Application Priority Data

Aug. 24, 1999 (JP) .......................................... 11-237132

(51) Int. Cl.[7] .......................... H01L 21/00; H01L 21/26
(52) U.S. Cl. ...................... 438/105; 438/487; 438/532; 438/535; 438/772; 438/931
(58) Field of Search .................. 438/105, 487, 438/532, 535, 584, 758, 931, 771, 772, 776, 777

(56) References Cited

U.S. PATENT DOCUMENTS 5,420,879 A * 5/1995 Kawarada et al. ............ 372/41

FOREIGN PATENT DOCUMENTS

| JP | 63288997 A | * 11/1988 | ........... C30B/29/04 |
| JP | A524991 | 2/1993 | |
| JP | A529244 | 2/1993 | |
| JP | A11100296 | 4/1999 | |
| JP | 11100296 A | * 4/1999 | ......... H01L/21/265 |

* cited by examiner

*Primary Examiner*—Matthew Smith
*Assistant Examiner*—Igwe U. Anya
(74) *Attorney, Agent, or Firm*—Birch, Stewart, Kolasch & Birch, LLP

(57) ABSTRACT

There is provided a method of reliably preparing a diamond semiconductor by irradiating diamond with a corpuscular ray. In this method, when a diamond substrate is irradiated with a corpuscular ray, the diamond substrate is maintained at a temperature of 300° C. to 2000° C., the angle of the surface of the diamond substrate irradiated is set within −20° to +20° to the (001) crystal plane of the diamond substrate, and the angle of the direction of the corpuscular ray is set within −20° to +20° to the <001> crystal orientation of the diamond substrate. Preferably, the direction of the corpuscular ray forms an angle of 3° to 10° with the <001> crystal orientation.

15 Claims, 4 Drawing Sheets

METHOD OF PREPARING DIAMOND SEMICONDUCTOR

BACKGROUND OF THE INVENTION

1. Field of the Invention

The present invention relates to a method of preparing diamond semiconductor and particularly to a method employing corpuscular radiation to render diamond semiconducting to obtain a diamond semiconductor used in the electronics industry as a semiconductor material e.g., for an element having resistance to environment.

2. Description of the Background Art

Ion implantation is a common technique to render Si, Ge and the like semiconducting. Ion implantation, however, also leaves damage in the ion-implanted region. Accordingly, a heat treatment needs to be performed thereon. Si, Ge and the like are most stable when they have a diamond-type crystal structure, and the heat treatment would recover their original crystallinity.

Diamond may also be ion-implanted and annealed to be rendered into a semiconductor. However, as for the crystal structure of carbon, diamond under the atmospheric pressure is a metastable phase; the most stable phase is graphite, and if the same process is applied to diamond to render it semiconducting as applied to Si, Ge and the like, the diamond would be converted into graphite, not a diamond semiconductor, at the ion-implanted region.

Japanese Patent Laying-Open No. 5-24991 discloses a method of preparing a diamond semiconductor including a step of using a laser beam to perform a heat treatment on diamond with dopant ions injected therein. It suggests that the laser beam can heat the diamond to repair a crystal defect caused by the ion injection.

Japanese Patent Laying-Open No. 5-29244 discloses a method of preparing a diamond semiconductor including a step of directing dopant ions to diamond in a channeling direction thereof such as <110>, <100>, or <121> directions. It suggests that injecting a dopant in a channeling direction can result in a reduced damage to the arrangement of the carbon atoms of the diamond and that such a damage can be compensated for by a heat treatment at 1400° C. In this method, the dopant radiated reaches a deep site of the diamond lattice.

Japanese Patent Laying-Open No. 11-100296 discloses a method of preparing a diamond semiconductor including a step of irradiating diamond heated to a temperature of 300° C. to 1500° C., with particles of a dopant element at a rate of $1 \times 10^7$ particles/cm$^2$·sec to $1 \times 10^{15}$ particles/cm$^2$·sec. It proposes that the temperature raised as above allows the diamond crystal to be efficiently recovered and that the diamond doped at the radiation rate range can readily recover in crystallinity.

SUMMARY OF THE INVENTION

In the prior art using a laser beam to perform a heat treatment, typically the laser beam should irradiate an area no more than 1 cm$^2$. If the diamond has a large area, the laser beam needs to scan the diamond, which would result in a complicated process. Furthermore, the time for the heat treatment after ion implantation increases in proportion to the area of the diamond.

In the prior art employing a dopant directed in a channeling direction of diamond, a collimated ion-beam is required and precise operation is needed for the diamond's channeling direction. Furthermore, injecting a dopant in a channeling direction with precision can result in the dopant reaching an unnecessarily deep site of the diamond lattice. Thus the dopant would be less controllable in depth.

As for the prior art controlling the temperature of diamond heated and the rate of corpuscular radiation, the present inventors have found that the diamond often fails to recover in crystallinity.

Accordingly, the present inventors have conducted researches into methods in which when applying corpuscular radiation, a diamond substrate or a thin film of diamond deposited on a substrate material is maintained at a high temperature to repair a crystal defect attributed to radiation.

An object of the present invention is to provide, based on this method, a method of preparing a diamond semiconductor capable of more reliably producing a diamond semiconductor.

Another object of the present invention is to provide a method capable of efficiently producing a diamond semiconductor by a relatively simple process.

It has been found that in a process employing corpuscular radiation for rendering diamond semiconducting, not only temperature but also the arrangement of the diamond crystal plane and the direction of the corpuscular radiation contribute to the recovery of crystallinity. Thus, suitable combinations of a temperature, an arrangement of the diamond crystal plane and a direction of corpuscular radiation have been found for recovery of the diamond crystal structure, resulting in the present invention.

The present invention is directed to a method of preparing a diamond semiconductor by irradiating, with a corpuscular ray, a diamond substrate or a thin film of diamond deposited on a base material, wherein when the corpuscular ray is applied, the diamond substrate or the thin film of diamond is maintained at a temperature of 300° C. to 2000° C., the surface of the diamond substrate or the thin film of diamond irradiated with the corpuscular ray forms an angle of −20° to +20° with the (001) crystal plane of the diamond substrate or the thin film of diamond, and the direction of the emitted corpuscular ray forms an angle of −20° to +20° with the <001> crystal orientation of the diamond substrate or the thin film of diamond. Under such conditions, the damage caused by the corpuscular radiation can be more efficiently repaired to produce a diamond semiconductor more reliably. Preferably the corpuscular ray is emitted in a direction offset relative to <001> crystal orientation by an angle of no less than 3°. Specifically, the direction of the emitted corpuscular ray preferably forms an angle of −20° to −3° or +3° to +20° with the <001> crystal orientation. More preferably, the angle between the direction of the emitted corpuscular ray and the <001> crystal orientation is 3° to 10°. Namely, the direction of the emitted corpuscular ray more preferably forms an angle of −10° to −3° or +3° to +10° with the <001> crystal orientation.

In addition, the corpuscular ray preferably irradiates the diamond substrate or the thin film of diamond having a temperature of at least 800° C. The radiation can be formed of particles of any or a combination of group-III elements, group-V elements, Li, S, and Cl. Preferably the corpuscular ray is emitted at a rate of $1 \times 10^{11}$ particles/cm$^2$·sec to $1 \times 10^{16}$ particles/cm$^2$·sec. Preferably the corpuscular ray is emitted with an energy of 100 eV to 10 MeV.

In a preferred embodiment of the present invention, p and n dopant particles may be introduced in a diamond substrate or a thin film of diamond at the regions adjacent to each other in a direction of depth to prepare a pn junction device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
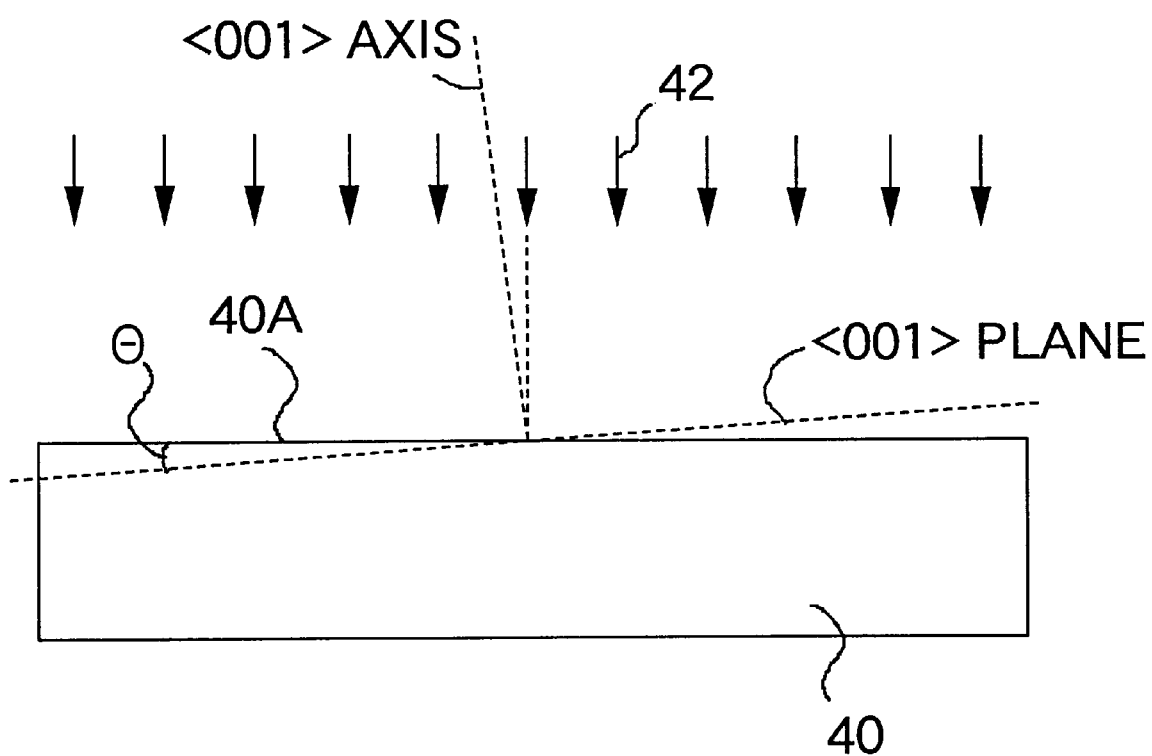
FIG. 4 is a schematic view showing an arrangement of the surface irradiated with the corpuscular ray and a direction of the corpuscular radiation to explain the present invention.

In the present invention, particles containing an element serving as a dopant are accelerated and directed upon diamond. In this process, as shown in FIG. 4, a diamond 40 to be doped has a surface 40a to be irradiated with corpuscular ray 42 and the surface 40a forms an angle θ (offset angle) of −20° to +20° with the (001) crystal plane of the diamond 40. In addition, the direction of the emitted corpuscular ray 42 is set within the range of ±20° from the <001> orientation of diamond. Furthermore, the diamond is maintained at a temperature of 300° C. to 2000° C. Under such conditions, the defect caused by the corpuscular radiation can be rearranged by the particles subsequently implanted and the diamond crystal can be prevented from becoming amorphous or graphite in the doping process.

When the substrate has a temperature of 300° C. to 2000° C., the above rearrangement can be induced and the diamond crystal can be recovered efficiently. If the substrate has a temperature lower than 300° C., the thermal agitation of the atoms is not active enough to induce or achieve the rearrangement. On the other hand, if the substrate has a temperature higher than 2000° C., the diamond phase would be transformed into the graphite phase. Preferably the substrate has a temperature of 800° C. to 2000° C., because such range of temperature can introduce and settle the dopant in a diamond crystal with a high percentage at a site allowing the dopant to be electrically active.

As described above, the diamond crystal employed in the present invention has a surface set within the range of ±20° from the diamond (001) plane for the irradiation with a corpuscular ray. Generally, an original surface of the diamond within the above range is used for the irradiation in the present invention. Alternatively, a surface within the above range may be prepared by polishing the diamond as needed. It has been found that the diamond (001) crystal plane can be rearranged efficiently and that the diamond crystal after the rearrangement can have the same structure as before the corpuscular radiation is applied. In contrast, the (111) and (110) planes are hardly rearranged, or if they are rearranged they can form polycrystals. As the offset angle of the irradiated surface with the (001) plane increases, the crystal planes other than the (001) plane would affect the rearrangement.

Additionally, in the present invention, the direction of the emitted particles is set within ±20° from the diamond <001> orientation. As the offset angle of the direction of the emitted particles with the <001> orientation increases, the crystal planes other than the (001) plane would affect the rearrangement. As the direction of the emitted particles becomes closer to the <001> orientation, the rearrangement of the crystal plane can efficiently proceed.

Thus, the offset angle of the irradiated surface set within ±20° with the (001) plane and the direction of the emitted particles set within ±20° from the <001> orientation can rearrange the crystal plane with an increased efficiency and produce the diamond semiconductor more reliably. In case that diamond is additionally vapor-deposited on the diamond after irradiation with the corpuscular ray, the surface to be irradiated should be as close to the (001) plane as possible, and therefore the offset angle is preferably not more than 5°. On the other hand, the angle between the direction of the emitted particles and the <001> orientation is preferably 3° to 10°. An angle of not less than 3° can prevent the implanted element from causing channeling and thus facilitate controlling the dopant in depth. An angle of not more than 10° allows a more efficient rearrangement.

In the present invention, as the particles emitted to render diamond a p-type semiconductor, group-III elements may be used in the form of a simple substance or ion, or in the form of a compound thereof or a mixture thereof. Preferably, the group-III elements include B, Al, Ga, In and Tl. As the particles emitted to render diamond an n-type semiconductor, group-V elements, Li, S, and Cl may be used in the form of a simple substance or ion, or in the form of a compound thereof or a mixture thereof. Preferably, the group-V elements include N, P, As, Sb and Bi. The group-III elements and the group-V elements are replaced with on lattice points of diamond and act as an electrically active acceptor and donor respectively. It is not clear why Li, S and Cl act as a donor. Li possibly enters an interstitial site and becomes active electrically.

The energy of the emitted particles is preferably 100 eV ($10^2$ eV) to 10 MeV ($10^7$ eV). An energy of less than 100 eV ($10^2$ eV) can be so low that it can be difficult to sufficiently introduce a dopant into diamond. Radiation with an energy of more than 10 MeV ($10^7$ eV) can cause defects with a higher density and make complex defects. Considering that particles emitted with an energy of less than 1 keV ($10^3$ eV) can result in dominant sputtering and that particles emitted with an energy of more than 2 MeV ($2 \times 10^6$ MeV) can require a large scale of the system, the energy of the emitted particles is more preferably 1 keV ($10^3$ eV) to 2 MeV ($2 \times 10^6$ MeV).

Preferably, the emission rate of the corpuscular radiation is $1 \times 10^{11}$ particles/cm$^2$·sec to $1 \times 10^{16}$ particles/cm$^2$·sec. A rate of less than $1 \times 10^{11}$ particles/cm$^2$·sec can be time-consuming and impractical for the corpuscular radiation. A rate of more than $1 \times 10^{16}$ particles/cm$^2$·sec can cause defects with a high density, which can prevent rearrangement from proceeding as desired. Although the above range allows an efficient crystal rearrangement, when time course of the level of the corpuscular radiation is controlled, the range of $1 \times 10^{11}$ particles/cm$^2$·sec to $1 \times 10^{13}$ particles/cm$^2$·sec is more preferable. A rate of less than $1 \times 10^{11}$ particles/cm$^2$·sec can be time-consuming, and a rate of more than $1 \times 10^{13}$ particles/cm$^2$·sec can reduce the irradiation time to about 10 seconds or less, with a dispersion increased.

In the present invention, the acceleration energy for the corpuscular radiation can be so controlled that the distribution of the dopant in depth can be controlled with accuracy. Thus, a pn junction device can readily be prepared by forming p layer at a shallow region from the crystal surface and an n layer at a deeper region adjacent to the p layer, or by forming an n layer at a shallow region from the crystal surface and a p layer at a deeper region adjacent to the n layer. Hereinafter the present invention will be described in more detail by illustrating examples.

EXAMPLES

Example 1

Figure 1:
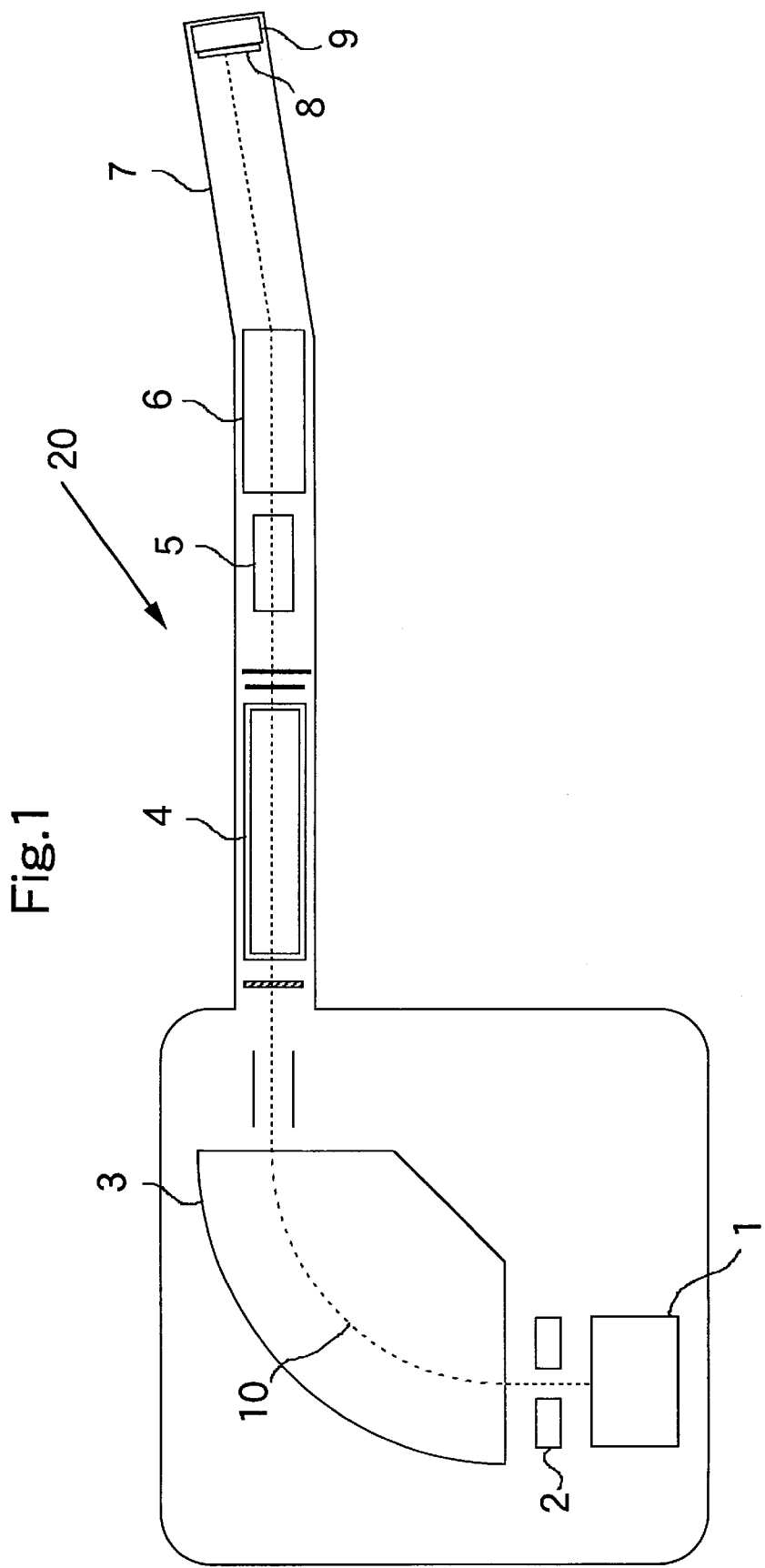
FIG. 1 is a schematic view of an ion implantation system used in the Examples.

Example 1 of the present invention will be described with reference to FIGS. 1 and 2. As shown in FIG. 1, an ion implantation system 20 has a substrate heating holder 9 for attaching a sample 8 thereto. Sample 8 used herein was a substrate of undoped monocrystalline diamond having a surface to be irradiated offset relative to the (001) plane by 4°. The substrate was maintained at a temperature of 1100° C. Sample 8 was irradiated with ions of B serving as a p dopant accelerated to 60 keV. The ions of B were emitted in a direction normal to that surface of the sample to be irradiated at a rate of $3\times10^{12}$ particles/$cm^2$·sec by $3\times10^{14}$ particles/$cm^2$. The ions of B were generated using a Freeman-type ion source 1 with a gas of $BF_3$ applied as a source material to create a plasma. The ions of B generated at ion source 1 were extracted by an extractor electrode 2 at an energy of 30 keV. An analyzer electromagnet 3 passed only $^{11}B$ among the B isotopes. Then the passed B ions were accelerated by an accelerator tube 4 to 60 keV. The accelerated ions then had their beam shaped by a Q lens 5. The shaped beam was introduced into sample 8 as the beam was scanned by a scanner unit 6 in the x and y directions.

To check whether the damage to the diamond crystal has been repaired after the radiation, a channeling analysis was conducted using Rutherford back scattering (RBS). In this analysis, $^4He^+$ accelerated to 1.6 MeV was directed upon the sample in its channeling direction and a solid-state detector was used to detect the number of $^4He^+$ scattering in a direction forming an angle of 170° with the incident beam and detect the energy level of the respective ions. If the sample is a complete crystal, the $^4He^+$ introduced in the channeling direction is less scattered and therefore the amount of $^4He^+$ scattered backward with the $^4He^+$ introduced in the channeling direction is reduced to approximately 1 to 5% of the amount of $^4He^+$ scattered backward with the $^4He^+$ introduced in random directions. If the sample is a damaged crystal and there exists interstitial atoms, the amount of $^4He^+$ scattered backward is increased even with the $^4He^+$ introduced in the channeling direction. This phenomenon can be used to estimate the crystallinity of the sample from the surface to a depth of several microns.

Figure 2:
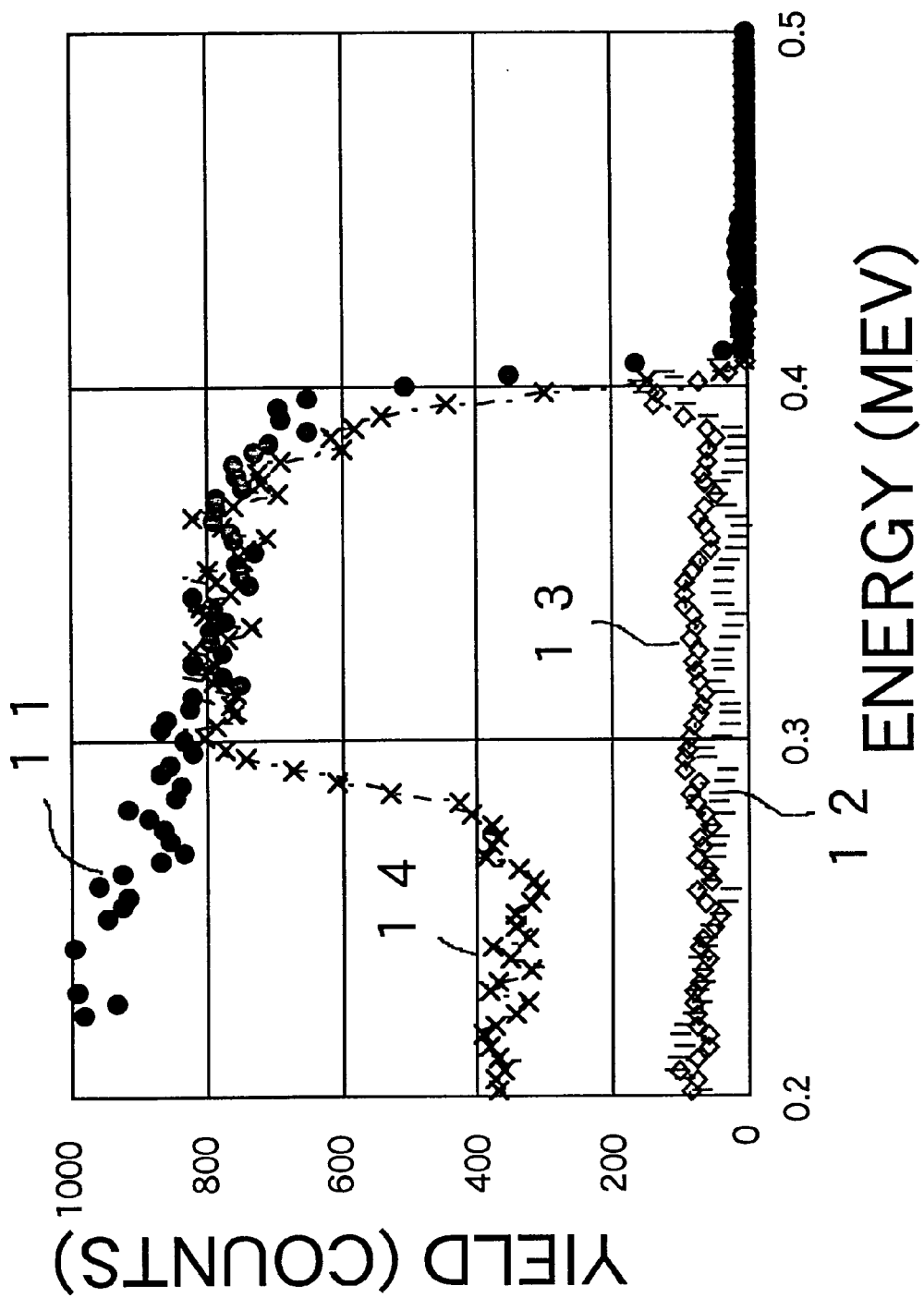
FIG. 2 plots a <001> RBS channeling spectrum of diamond with B ion-implanted in Example 1.

FIG. 2 plots a carbon <001> channeling spectrum of the sample prepared in this example. Also plotted for comparison is a result of an analysis of a sample implanted with B under similar conditions to the example except that the substrate was not heated. In FIG. 2, the high-energy side from the rise corresponds to the surface of the sample and the low-energy side corresponds to an inner portion from the surface. No. 11 represents an RBS spectrum with the $^4He^+$ introduced in random directions, No. 12 represents a channeling spectrum of the diamond substrate before B ion implantation, No. 13 represents a channeling spectrum of the diamond substrate implanted with B ions according to Example 1, and No. 14 represents a channeling spectrum of the diamond substrate implanted with B ions without heating the substrate. The result reveals that when the substrate is not heated the sample is amorphous from its surface to a depth of approximately 100 nm whereas under the conditions of the present example the sample has recovered in crystallinity to approximately 3% as calculated in the atom displacement concentration. The carbon <111> channeling analysis of the sample has also resulted in a similar conclusion, demonstrating that the crystal has recovered from the damage caused by the irradiation. Additionally, an infrared absorption spectrum has shown an absorption of B placed on the lattice sites. The evaluation test for the electrical characteristics of the diamond has shown significantly good p-type characteristics, such as an activation energy of 0.35 eV and a hole mobility of 1500 $cm^2$/V·s at room temperature. Irradiation with Al, a group-III element, has also produced a similarly good p-type diamond semiconductor. Another similar result has also been obtained with a thin film of diamond hetero-epitaxially grown on a substrate of BN, Pt or the like in place of the substrate of undoped monocrystalline diamond. Furthermore, the substrate of undoped monocrystalline diamond can be replaced by an n-type diamond to prepare a pn junction.

Example 2

Example 2 of the present invention will be described with reference to FIG. 1. As shown in FIG. 1, similar to Example 1, an ion implantation system 20 has a substrate heating holder 9 for attaching a sample 8 thereto. Sample 8 used herein was a substrate of a B-doped, p-type monocrystalline diamond having a surface to be irradiated offset relative to the (001) plane by 10°. The substrate was maintained at a temperature of 1000° C. Sample 8 was irradiated with ions of S serving as an n dopant accelerated to 150 keV. The S ions were emitted in a direction normal to the sample at a rate of $1\times10^{12}$ particles/$cm^2$·sec by $5\times10^{14}$ particles/$cm^2$. The S ions were generated using a Freeman-type ion source 1 with a gas of $SF_6$ applied as a source material to create a plasma. The S ions generated at ion source 1 were extracted by an extractor electrode 2 at an energy of 30 keV. An analyzer electromagnet 3 passed only $^{32}S$ among the S isotopes. Then the passed S ions were accelerated by an accelerator tube 4 to 150 keV. The accelerated ions then had their beam shaped by a Q lens 5. The shaped beam was then introduced into sample 8 as the beam was scanned by a scanner unit 6 in the x and y directions. As described in Example 1, a carbon RBS channeling analysis was conducted for the sample. As a result, an RBS channeling spectrum similar to that in FIG. 2 was obtained and it has been found that as for both of the <001> and <111> directions, the damage caused by the irradiation in a vicinity of the sample surface is reduced to approximately 4%, as calculated in the atom displacement concentration. The evaluation test for the electrical characteristics has revealed that the diamond has good rectification properties and that a region with an n dopant implanted therein serves as a good n-type diamond to provide a pn junction.

To examine the characteristics of only the n-type diamond semiconductor region, a similar experiment was carried out with a substrate of undoped monocrystalline diamond in place of the B-doped p-type monocrystalline diamond. The evaluation test for the electrical characteristics has shown a significantly good n-type characteristic, such as an activation energy of 0.32 eV and an electron mobility of 700 $cm^2$/V·s. As the n dopant to be implanted, a different group-V element, Li or Cl may be used in the form of a simple substance or ion, or in the form of a compound thereof or a mixture of thereof. Besides the monocrystalline diamond substrate, a thin homoepitaxially or heteroepitaxially grown diamond film also allowed a good n-type conductive layer to be formed in a region with an n-dopant implanted.

Example 3

A method of obtaining a pn junction according to the present invention will be described with reference to FIGS.

Figure 3:
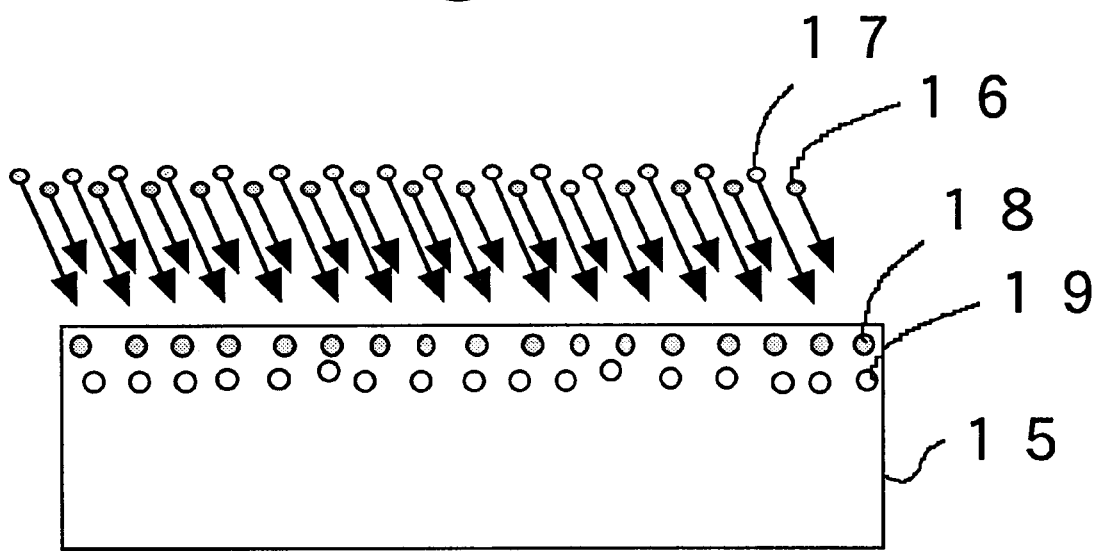
FIG. 3 schematically shows a sample prepared in Example 3.

1 and 3. As shown in FIG. 1, an ion implantation system 20 has a substrate heating holder 9 for attaching a sample 8 thereto. Sample 8 used herein was a substrate of monocrystalline diamond with a thin film of undoped diamond homoepitaxially grown thereon, in which the surface forms an offset angle of 5° with the (001) plane. The substrate was maintained at a temperature of 700° C. FIG. 3 is an enlarged view of sample 8. Thin undoped diamond film 15 was irradiated with Al ions 16 serving as a p dopant accelerated to 100 keV. The ions were introduced in a direction forming an offset angle of 10° with the normal to the sample surface at a rate of $1\times10^{12}$ particles/cm$^2$·sec by $2\times10^{14}$ particles/cm$^2$. Subsequently, thin film 15 was irradiated with P ions 17 serving as an n dopant accelerated to 250 keV. The ions were introduced in a direction forming an offset angle of 10° with the normal to the sample at a rate of $2\times10^{12}$ particles/cm$^2$·sec by $4\times10^{14}$ particles/cm$^2$. The Al ions were generated using a Freeman-type ion source 1 with a simple substance of Al vaporized. The Al ions generated at ion source 1 were extracted by an extractor electrode 2 at an energy of 30 keV. An analyzer electromagnet 3 passed $^{27}$Al. Then the passed Al ions were accelerated by an accelerator tube 4 to 100 keV. The accelerated ions then had their beam shaped by a Q lens 5. The shaped beam was then introduced into the sample 8 as the beam was scanned by a scanner unit 6 in the x and y directions. Subsequently, P ions were generated using Freeman-type ion source 1 with solid P heated with an oven. The P ions generated at ion source 1 were extracted by extractor electrode 2 at an energy of 30 keV. Analyzer electromagnet 3 passed $^{31}$P. Then the passed P ions were accelerated by accelerator tube 4 to 250 keV. The accelerated ions then had their beam shaped by Q lens 5. The shaped beam was then introduced into sample 8 as the beam was scanned by scanner unit 6 in the x and y directions. FIG. 3 shows the positions of the p and n dopants introduced in the sample. Al atoms 18 are introduced in the sample at a shallow region from the sample surface and P atoms 19 at a region deeper than Al atoms 18.

To check the crystallinity of the diamond, a carbon RBS channeling analysis was conducted, as described in Examples 1 and 2. As a result, it has been found that as for both of <001> channeling and <111> channeling, the damage caused by the irradiation in a vicinity of its surface is reduced to approximately 9%, as calculated in the atom displacement concentration. The evaluation test for the electrical characteristics has revealed that the diamond has good rectification properties and that the region implanted with Al ions serving as a p dopant forms a p-type semiconductor and that implanted with P ions serving as an n dopant forms an n-type semiconductor.

A similar result was also obtained with another group-III element, B in place of Al as the p dopant. Another group-V element such as As, or Li, S or Cl can be substituted for P as the n dopant. In this example, a thin film of diamond heteroepitaxially grown on a substrate of BN, Pt or the like, or a monocrystalline diamond substrate can be substituted for the thin film of the undoped diamond homoepitaxially grown on the monocrystalline diamond substrate. In this example, a temperature of not less than 800° C. can be substituted for a temperature of 700° C. as the substrate temperature at the irradiation to obtain a pn junction having better rectification properties.

Thus, the corpuscular radiation according to the present invention can introduce a dopant into diamond with good controllability, so that a high yield of diamond semiconductor can be achieved and semiconductor device fabrication using diamond can be facilitated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing a diamond semiconductor by irradiating with a corpuscular ray a diamond substrate or a thin film of diamond deposited on a substrate material, comprising:
    maintaining said diamond substrate or said thin film of diamond at a temperature of 300° C. to 2000° C. when applying said corpuscular ray;
    setting an angle of a surface of said diamond substrate or said thin film of diamond irradiated with said corpuscular ray within the range of −20° to +20° to the (001) crystal plane of said diamond substrate or said thin film of diamond; and
    setting an angle of the direction of said corpuscular ray within the range of −20° to +20° to the <001> crystal orientation of said diamond substrate or said thin film of diamond.

2. The method of claim 1, wherein the direction of said corpuscular ray forms an angle of −20° to −3° or +3° to +20° with said <001> crystal orientation.

3. The method of claim 1, wherein the direction of said corpuscular ray forms an angle of −10° to −3° or +3° to +10° with said <001> crystal orientation.

4. The method of claim 1, wherein said corpuscular ray irradiates said diamond substrate or said thin film of diamond having a temperature of at least 800° C.

5. The method of claim 1, wherein said corpuscular ray includes at least a group-III element.

6. The method of claim 1, wherein said corpuscular ray includes at least one of a group-V element, Li, S and Cl.

7. The method of claim 1, wherein said corpuscular ray is emitted at a rate of $1\times10^{11}$ particles/cm$^2$·sec to $1\times10^{16}$ particles/cm$^2$·sec.

8. The method of claim 1, wherein said corpuscular ray is emitted with an energy of 100 eV to 10 MeV.

9. The method of claim 1, wherein particles serving as a p dopant and those serving as an n dopant are introduced in said diamond substrate or said thin film of diamond at regions adjacent to each other in a direction of depth to prepare a pn junction device.

10. A method of preparing a diamond semiconductor by irradiating with a corpuscular ray a diamond substrate or a thin film of diamond deposited on a substrate material, comprising:
    maintaining said diamond substrate or said thin film of diamond at a temperature of 300° C. to 2000° C. when applying said corpuscular ray;
    setting an angle of a surface of said diamond substrate or said thin film of diamond irradiated with said corpuscular ray within the range of −20° to +20° to the (001) crystal plane of said diamond substrate or said thin film of diamond; and
    setting an angle of the direction of said corpuscular ray within the range of −20° to −3° or +3° to +20° to the <001> crystal orientation of said diamond substrate or said thin film of diamond,
    wherein said corpuscular ray is emitted at a rate of $1\times10^{11}$ particles/cm$^2$·sec to $1\times10^{16}$ particles/cm$^2$·sec and with an energy of 100 eV to 10 MeV.

11. The method of claim 10, wherein the direction of said corpuscular ray forms an angle of −10° to −3° or +3° to +10° with said <001> crystal orientation.

12. The method of claim 10, wherein said corpuscular ray irradiates said diamond substrate or said thin film of diamond having a temperature of at least 800° C.

13. The method of claim 10, wherein said corpuscular ray includes at least a group-III element.

14. The method of claim 10, wherein said corpuscular ray includes at least one of a group-V element, Li, S and Cl.

15. The method of claim 10, wherein particles serving as a p dopant and those serving as an n dopant are introduced in said diamond substrate or said thin film of diamond at regions adjacent to each other in a direction of depth to prepare an pn junction device.

* * * * *